United States Patent
Jensen et al.

(10) Patent No.: US 7,335,257 B2
(45) Date of Patent: Feb. 26, 2008

(54) APPARATUS FOR AND METHOD OF MANUFACTURING A SINGLE CRYSTAL ROD

(75) Inventors: Leif Jensen, Frederikssund (DK); Jan Eyving Petersen, Frederikssund (DK); Per Vabengard, Kirke Hyllinge (DK)

(73) Assignee: Topsil Semiconductor Materials A/S, Frederikssund (DK)

( * ) Notice: Subject to any disclaimer, the term of this patent is extended or adjusted under 35 U.S.C. 154(b) by 154 days.

(21) Appl. No.: 10/545,187

(22) PCT Filed: Feb. 6, 2004

(86) PCT No.: PCT/DK2004/000087

§ 371 (c)(1),
(2), (4) Date: Nov. 8, 2005

(87) PCT Pub. No.: WO2004/072333

PCT Pub. Date: Aug. 26, 2004

(65) Prior Publication Data

US 2006/0191471 A1 Aug. 31, 2006

(30) Foreign Application Priority Data

Feb. 11, 2003 (DK) .............................. 2003 00193

(51) Int. Cl.
*C30B 13/02* (2006.01)
*C30B 13/16* (2006.01)
*C30B 13/20* (2006.01)
*C30B 13/30* (2006.01)

(52) U.S. Cl. ............................ 117/49; 117/11; 117/51; 117/214

(58) Field of Classification Search ................... 117/11, 117/49, 50, 51, 52, 214
See application file for complete search history.

(56) References Cited

U.S. PATENT DOCUMENTS

| | | | |
|---|---|---|---|
| 3,615,245 A | 10/1971 | Emeis et al. | |
| 4,708,764 A | 11/1987 | Boden et al. | |
| 5,476,063 A * | 12/1995 | Nakatani et al. | ............... 117/11 |
| 5,688,321 A * | 11/1997 | Kimura et al. | ............... 117/200 |
| 6,663,711 B1 * | 12/2003 | Wollweber et al. | ............ 117/37 |

FOREIGN PATENT DOCUMENTS

| | | |
|---|---|---|
| DE | 196 10 650 A1 | 11/1997 |
| EP | 0 288 605 A2 | 11/1988 |
| JP | 3 257091 A | 11/1991 |
| JP | 9 077588 A | 3/1997 |
| JP | 2000 044380 A | 2/2000 |
| WO | WO 01/06041 A1 | 1/2001 |

\* cited by examiner

*Primary Examiner*—Felisa Hiteshew
(74) *Attorney, Agent, or Firm*—Jacobson Holman PLLC (57) ABSTRACT

An apparatus is provided for manufacturing a single crystal rod from a poly crystal feed rod including a closed chamber at which chamber the feed rod is located. The chamber has an annular energy supply arranged around the feed rod for melting off the one end of the rod for providing single crystals. Actuators are provided, for axial movement of the feed rod and for a rotating relative movement between the feed rod and the annular energy supply The apparatus further includes components for recording and regulating the distance between the surface of the feed rod and an annular inwardly radially facing reference face associated with the energy supply The resulting apparatus and method that enable use of irregular feed rods that assume other shapes than the optimal cylindrical shape and also enable use of curved cylindrical and elliptical rods with irregular surfaces.

16 Claims, 7 Drawing Sheets

APPARATUS FOR AND METHOD OF MANUFACTURING A SINGLE CRYSTAL ROD

This application is a 371 of PCT/DK04/000087 filed Feb. 6, 2004.

BACKGROUND OF THE INVENTION

1. Field of the Invention

The present invention relates to an apparatus for manufacturing a single crystal rod from a polycrystal feed rod, said apparatus comprising a closed chamber, at which chamber the feed rod is located, said chamber comprising an annular energy supply arranged around the feed rod for melting off the one end of the rod for providing single crystals, said apparatus comprising first moving means for axial movement of the feed rod and second moving means for a rotating relative movement between the feed rod and the annular energy supply.

The present invention also relates to a method of manufacturing a single crystal rod from a polycrystal feed rod, said feed rod comprising a melting zone at the end of the rod, which melting zone is provided by means of an annular energy supply arranged around the feed rod, and in that, in the area below the melting zone single crystals are provided, which feed rod is, by means of first means moved in axial direction, and that, by the second means, a rotating relative movement is provided between the surface of the feed rods and the energy supply.

2. Description of the Related Art

In connection with the manufacture of single crystals, it is known to use the so-called float-zone technique. The technique is used in particular for the manufacture of silicon single crystals.

Application of the float-zone alias floating zone alias float zone technique (FZ) to grow silicon single crystals were first reported by Keck and Golay. The FZ crystals are purer than Czochralsky zone technique (Cz) ingots since the silicon melt used for crystal growth is not contained by a crucible. Large diameter silicon ingots are more difficult to grow by the FZ than by Cz technique. However, the progress of the FZ technique has been able to keep pace with the Cz, and crystals with diameters of between 150 and 200 mm in R&D have been grown in production.

First, the bottom end of a polysilicon rod is preheated. This end of the rod is ground into a v-shape and is placed in the centre of a water cooled, single-turned copper induction coil. A conducting susceptor e.g. graphite is then placed underneath the polysilicon rod with a minimal gap. When an rf current is applied to the copper coil, and electrical eddy current is induced in the susceptor and the temperature of the susceptor increases. The heat is then transferred to the polysilicon rod by radiation. Once the portion of polysilicon in close proximity to the susceptor starts to glow, the eddy current can be induced in this segment of silicon by the rf energy. The graphite susceptor is no longer needed and is removed from the rf coil. The heat is continuously applied until the cone segment of the polysilicon rod melts. Subsequently, a seed is dipped into the molten silicon from below.

Once the seed is wetted by the molten silicon, the growth of a crystal can be initiated by lowering the seed. The polysilicon rod also need to be lowered, but with a much slower rate. As in the Cz technique, dislocation-free growth should be initiated during the seeding process by using fast pull rates. Once the dislocation-free structure is observed (due to the appearance of strong side facets), the ratio of pull rates between the seed and polyrod is gradually decreased so that the crystal diameter will gradually increase. A dopant gas can also be introduced during the growth process.

A critical factor for successful float-zone growth is maintaining the stability of the molten zone. The zone is stable when the inward pressure of the zone is greater than the outward pressure. The inward pressure includes surface tension, cohesion between the solid and liquid, and electromagnetic pressure due to the rf field. The latter two terms are relatively small as compared to the surface tension. The outward pressure mainly includes the hydrostatic pressure resulting from the gravitational force of the molten zone. The hydrostatic pressure is directly proportional to the zone height. Therefore, the molten zone should be kept as narrow as possible.

Frequency of the rf energy is also an important parameter. It is inversely proportional to the penetration depth of the rf energy and electromagnetic force on the melt. It has been suggested that the optimum frequency is between 2 and 3 MHz. When the frequency is below 500 kHz, an undesirable surface melting can occur. On the other hand, a frequency higher than 3 MHz increases the possibilities for arcing.

The FZ technique is used e.g. in WO 01/06041.

However, in connection with the manufacture of single crystals, it is a problem that the feed rod as such that forms the starting point for forming a single crystal rod, essentially must be a circular cylinder with the walls parallel to the longitudinal axis of the cylinder. Likewise it is also required that the surface of the feed rod of a polycrystal rod is smooth and has a low degree of roughness. It is therefore necessary that the feed rod initially to forming the basis of the manufacture of single crystals undergoes a processing, which—in addition to a purification—also includes grinding, whereby the surface is caused to appear fairly smooth, and that the cylinder rod is a circular cylinder, imperfections thus being removed.

SUMMARY OF THE INVENTION

It is not possible to use non-cylindrical rods in the prior art, when they have deflections to such an extent that they assume banana-like and curved shapes. It is therefore desirable to improve the prior art in such a manner that it is possible to use feed rods that have, on the one hand, an irregular surface and, on the other, also assume other shapes than that of the true cylinder rod, including the curved, somewhat banana-like shape. Hereby less expensive and less finished feed rods can be used for the manufacture of single crystal rods that are used e.g. in the semiconductor industry and are also used in connection with the manufacture of semiconductor photo voltaic cells. Following manufacture of the single crystal rod it will be cut into wafers.

It is the object of the invention to provide an apparatus and a method that enable use of the above-mentioned irregular feed rods that assume other shapes than the optimal cylinder shape and also enable the use of curved cylindrical and elliptical rods with irregular surfaces.

The object is achieved by an apparatus for manufacturing a single crystal rod from a poly crystal feed rod, the apparatus having a closed chamber at which the feed rod is located. The chamber has an annular energy supply arranged around the feed rod for melting off the one end of the rod for providing single crystals. First and second moving means are provided for axial movement of the feed rod and for a rotating relative movement between the feed rod and the annular energy supply, respectively. The apparatus according to the present invention further includes a monitoring system for recording the distance between the surface of the feed rod and an annular inwardly radially facing reference face associated with the energy supply, and third moving means for regulating the distance.

The object is also achieved by a method of manufacturing a single crystal rod from a poly crystal feed rod having a melting zone at the end of the rod. The melting zone is provided by means of an annular energy supply arranged around the feed rod. In the area below the melting zone, single crystals are provided. The feed rod is moved in axial direction by a first means, with a second means providing a rotating relative movement between the surface of the feed rods and the energy supply. The distance between an annular inwardly radially facing reference face and the feed rod surface is recorded by means of a monitoring system and is regulated by means of third moving means such that, at a given point in time, the distance is the same throughout the entire circumference of the rod measured between the surface and the reference face. A feed rod, primarily a silicon feed rod, is located in a closed chamber and e.g. as is described in WO 01/06041. An annular recess at the one end of the rod was initially milled out, whereby e.g. gripper hooks are allowed to seize around this part of the rod. The apparatus comprises an actuator for rotating and shifting the feed rod in the vertical direction and underneath the feed rod there is, in the chamber, located a seed from which the single crystals are formed when the melt from the feed rod is placed there onto by use of the FZ. The melting off of the feed rod occurs by means of a single turn induction ring that is located opposite the end of the feed rod, where said recess is configured. This end, which is the melting end for the feed rod, can have a tapered end to enable correct positioning relative to the induction coil. The induction coil might be supplemented with a heat reflector as described in DE-19610650, the technical features of which are incorporated herein by the reference. Further, the chamber comprises a process window through which a camera system located outside the chamber is able to record pictures, the lens focusing here on the registration area corresponding to the induction coil. The camera takes pictures corresponding to approximately 1-30 pictures per second, and these recordings are transmitted to a computer unit that records the position of the induction coil relative to the surface of the feed rod. These recordings from the so-called registration system are relayed to a regulation system, in which the values for the position of the induction coil relative to the not-melted surface in the X and Y directions, respectively, are calculated in order to ensure a uniform distance between the periphery of the feed rod and the induction coil all way around. The X direction is measured radially and horizontally on the centre line of the feed rod and Y perpendicular and horizontally there from and in the same plane, which calculated values are compared to pre-entered ideal values.

These ideal values are obtained by registering the diameter and the deflection of the rod and whereby the centre point of the rod is laid down. The ideal values are where the centre of the rod is identical with the calculated centre of the rod, this being a reference point.

The reference face is identical to the inner face of the induction coil or under some circumstances a ring that is congruent with the induction coil.

The regulation system then transmits information to the so-called third moving means that comprise actuators/motors that perform a regulation in the X and Y directions, respectively, of the location of the feed rod. These actuators are, like the actuator for the axial movement, located outside the chamber, but constitute an integral part of the apparatus as such. By means of this closed loop, a continuous regulation of the position feed rod is continuously carried out, measured in the X and Y directions relative to the centre of the induction coil such that the feed rod will, irrespective whether it has a curved shaped and thus, during its rotation, should assume changing distances to the reference face instead, due to the functioning of the regulation loop, will be continuously displaced. Hereby the distance measured between the reference face and the not-melted surface of the feed rod will continuously be corrected to assume the pre-entered reference distances-the so-called ideal values-whereby compensation is made for the curved shape and whereby the surface will continuously assume the same distance to the induction coil measured at a given point in time and in the entire circumference of the feed rod. Hereby even melting off of the feed rod down onto the underlying single crystal is ensured, whereby the quality of the single crystal is ensured in such a manner that it grows to a single crystallised rod.

It is noted that in this case the reference point of the feeding rod is placed along the centreline of the feed rod. However other reference points could be chosen. The important thing is that the diameter and the deflection of the rod are established before melting occurs in order to obtain a reference point for the feed rod.

The apparatus according to the invention may further be provided with a regulating system that controls and regulates the third moving means as a function of the recordings of the monitoring system. The regulation system preferably includes a microprocessor for calculating the regulation of the feed rod relative to ideal values for the location of the rod. In this way a convenient loop is accomplished for controlling and moving the feed rod relative to the annular energy supply.

The third moving means can also provide movement in a translatory, preferably horizontal, direction. Accordingly, the third moving means may be embodied using actuators for movement of the feed rod in the X and Y directions, with the directions being horizontal and perpendicular to each other.

The first and second moving means can also be embodied using actuators, although other types of motors may also be used.

The annular energy supply can include an induction coil to provide the annular power-supply function. The energy supply might also include a heat reflector.

The present invention may further include movement means for axial displacement of a crystal rod, thereby providing the technical elements for providing a floating zone.

Finally, the monitoring system may be embodied to include at least one camera located outside the chamber such that convenient monitoring as such of the melting area, designated the floating zone, is also accomplished. Alternative detection systems are also contemplated, e.g. laser beam, electrical impulses and the like.

According to the method of the present invention, the melting zone may be provided with an induction coil, and the reference face may be provided by a heat reflector associated with the induction coil or the induction coil itself, the reference face being congruent with the induction coil.

By the method, the single crystal rod grows from the melting by a basic method that includes a floating zone method, and the feed rods may preferably be comprised essentially of silicon.

Finally, the invention relates to use of an apparatus for exercising the method.

BRIEF DESCRIPTION OF THE DRAWINGS

In the following, the invention is further disclosed with detailed description of preferred embodiments. -Reference is made to the drawing, wherein.

DETAILED DESCRIPTION OF THE PREFERRED EMBODIMENTS

Further scope of applicability of the present invention will become apparent from the detailed description given hereinafter. However, it should be understood that the detailed description and specific examples, while indicating preferred embodiments of the invention, are given by way of illustration only, since various changes and modifications within the spirit and scope of the invention will become apparent to those skilled in the art from this detailed description.

Figure 1:
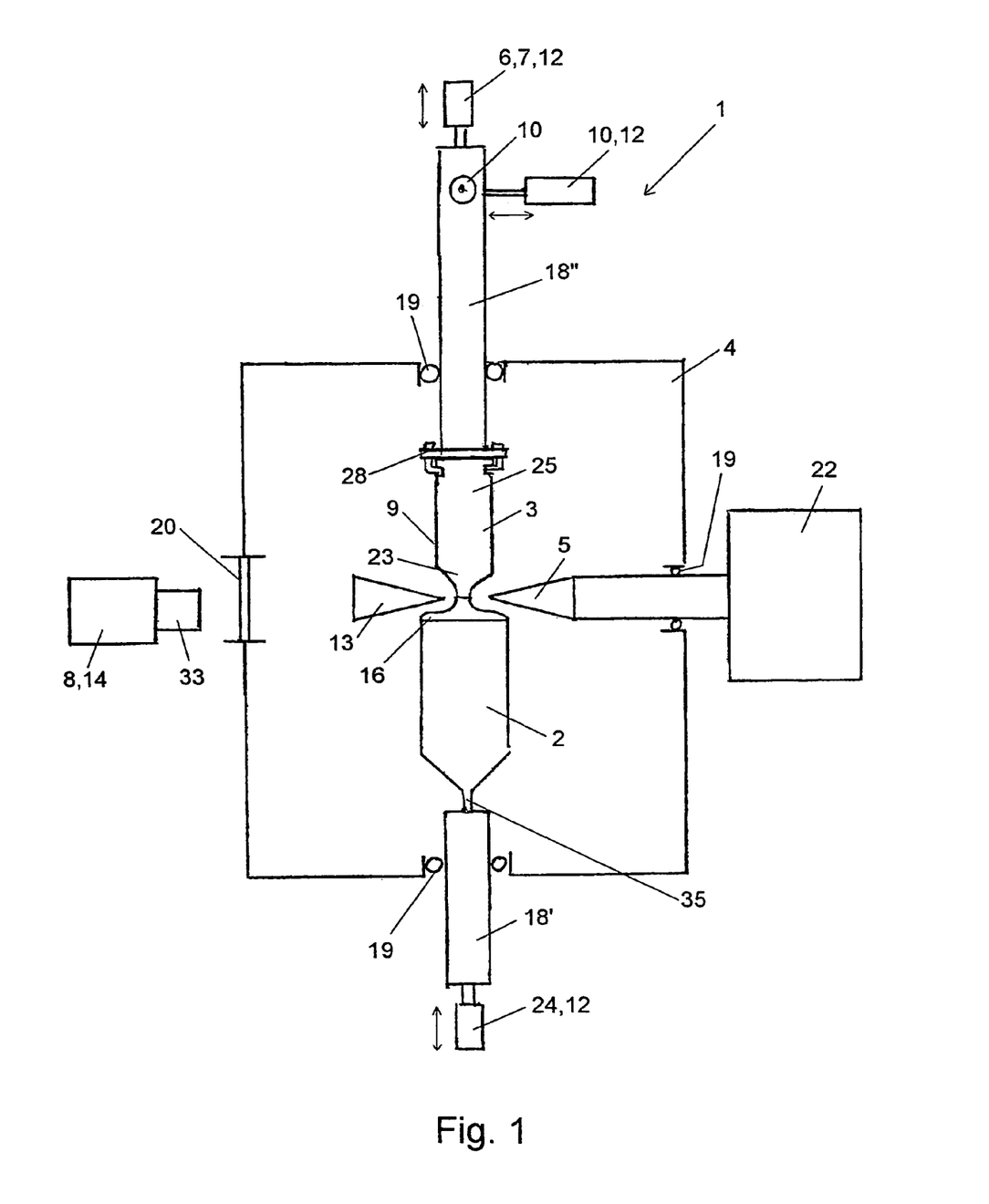
FIG. 1 is an exemplary embodiment of an apparatus according to the invention with the various moving means and the location of the camera relative to the chamber.

FIG. 1 shows an exemplary embodiment of an apparatus 1 according to the invention comprising a closed chamber 4 in which the process takes place, which process is the so-called FZ-process, floating zone process. In the chamber is located a polycrystalline feed rod 3 that is, via a holding system comprising a carrier base plate 28, connected to an upper shaft 18", said shaft extending from the chamber as such and outwards. Between the outlet of the shaft 18" and the chamber walls, a flexible seal 19 is provided to ensure that the chamber remains closed and sealed relative to the surroundings. The upper shaft 18" is suspended in such a manner that, via moving means 6 in the form of an actuator 12, it is axially displaceable, which actuator also comprising second movement means 7 that bring about rotation. These moving means ensure that the poly crystalline feed rod 3 is moved downwards in axial direction of movement during melting off, while simultaneously a rotation takes place, thereby bringing about a continuous melting all the way around the feed rod.

Furthermore the moving means also comprises third moving means 10, also in the form of actuators, thereby providing movement of the feed rod in translatory and horizontal directions, wiz in the X and Y directions, respectively, which coordinates are perpendicular to each other and thus also perpendicular relative to the axial movement in the Z-direction as described above.

In the chamber an induction coil 13, which is single-coiled, is provided around the feed rod. The induction coil could be shaped as taught in DE-19610650 and further comprises a heat reflector that also would serve as -reference face. A more detailed description of this will appear in connection with FIG. 7.

The induction coil referred to as an annular energy supply 5 receives energy from an energy supply 22 arranged outside the chamber. Also here the connection to the induction coil situated in the interior chamber 4 will be surrounded by a flexible seal 19 to ensure that the chamber is sealed relative to the surroundings. Underneath the feed rod 3 there is, at the onset of the process, arranged a seed 35 that is to form the basis of the growth of a single crystal rod 2. This seed is located on the top of a lower shaft 18' that will, also by use of means arranged outside the chamber in the form of an actuator see to an axial displacement of the seed and the subsequently formed single crystal rod 2 such that, during its growth, it maintains its convenient distance to the induction coil 13.

Furthermore, outside the chamber 4 there is a monitoring system 8 in the form of a camera system that is capable of recording individual pictures. Typically it records 1-30 pictures per second. The lens of the camera is directed towards a process window 20 located in the chamber 4, through which the camera takes pictures of the area in which the melting takes place and designated the molten zone 16. The camera will thus record/register the distance between the induction coil or the heat reflector 17 and its distance to the not-melted or melted surface 9 of the feed rod 3.

The recordings will register the distance in the X as well as the Y direction, the rotation of the feed rod ensuring that information on the location of the feed rod circumference relative to the heat reflector or induction coil is continuously available, which heat reflector is also circular and has a larger diameter than the feed rod as such. The melting off of the feed rod takes place at the upper end 23 thereof, opposite the suspension system.

Figure 2:
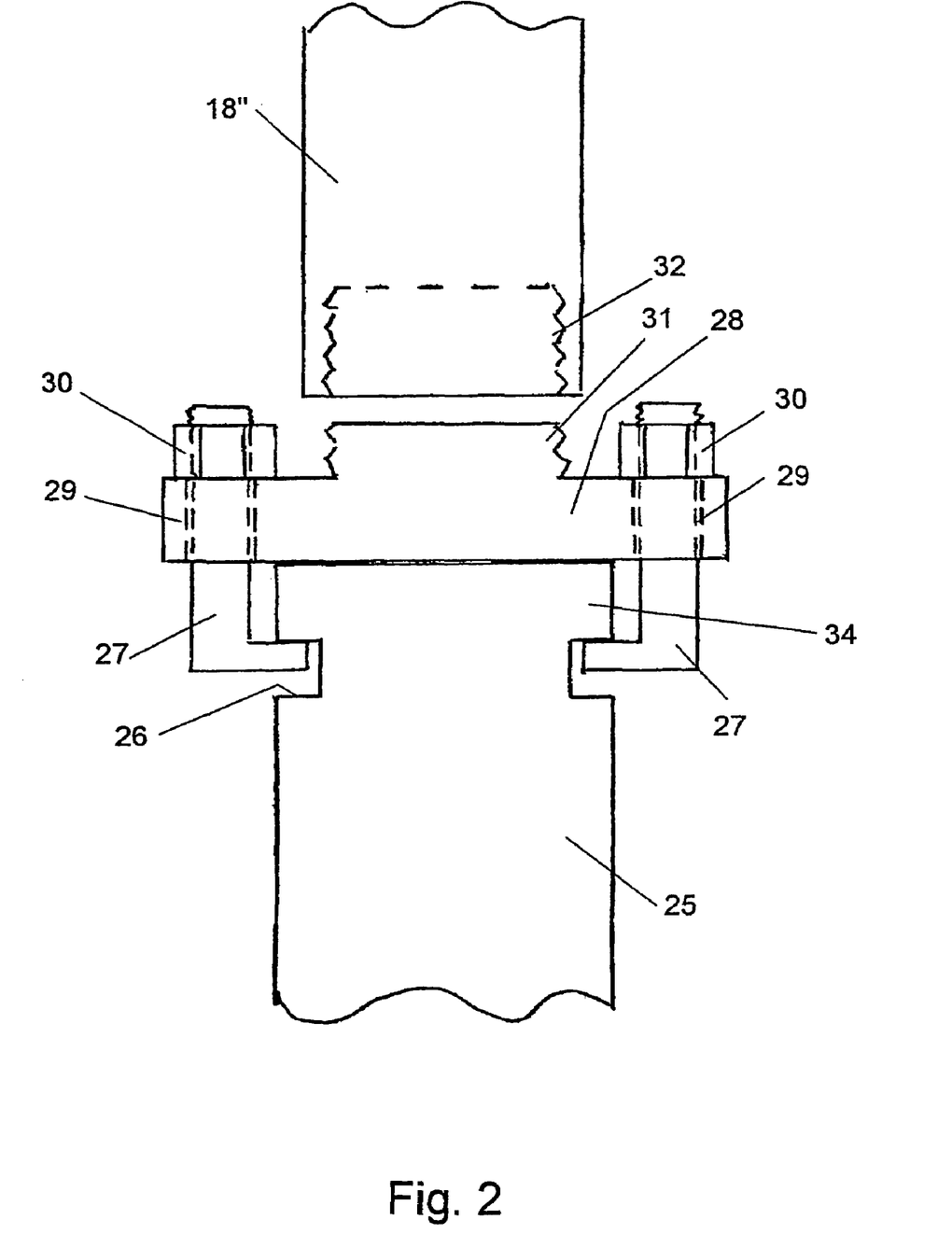
FIG. 2 shows the holding system for the feed rod to the movable unit of the apparatus.

FIG. 2 shows the connection between the upper shaft 18" and the other end 25 of the feed rod 3 as such, an annularly extending recess 26 being provided at the other end of the feed rod and oriented opposite the melting area, in which gripper hooks 27 are mounted. These gripper hooks are, via threads 29, mounted in connection with a carrier base plate 28 and secured and fastened via bolts 30, whereby the inwardly projecting part of the gripper hooks are secured in the collar 34 formed on the feed rod, and by fastening of the bolts 30 the basis of the feed rod will have a firm abutment on the lower face of the carrier base plate 28. The upper face of the carrier base plate 28 is equipped with a pin with an external thread 31, which external thread mates with an interior thread 32 arranged in the one end of the upper shaft 18" and corresponds to a commonly known spindle arrangement.

As mentioned above, the feed rod 3 used may assume a curved shape, which is quite new, the regulation system taking into account—as will be described below—that the distance between the melting end of the curve-shaped/banana-shaped feed rod and the induction coil throughout the entire circumference of the rod will constantly assume the same value. Before melting the feed rod a registration of the centre of the induction coil and a registration of the diameter and the deflection of the rod takes place. This is done by turning the rod one turn and via pictures or a set of measuring taken during this process calculates and registers the dimensions. In this context it is noted that, in order to measure the quality of a rod, a measurement is performed of the clearing that is produced when a cylinder rod is arranged with the axis parallel with a smooth surface and where the largest distance between the highest point of the curve and the basis is measured. Till now it has been possible to perform melt offs with a bow of up to 3-4 mm. With the novel apparatus and the novel method it is possible to perform melt offs with a clearance of up to between 15 and 20 mm.

It should also be mentioned that it is possible to use a feed rod with a very dimpled and as grown surface, a surface that, in principle, looks somewhat like closely adjoining popcorn, an induction coil being used that also comprises a reflector. The reflector is used in order to facilitate the heat balance. In cases where a feed rod is used having a smooth surface and not a rough one, but wherein the feed rod is curved, the induction coil in itself is sufficient. Typically, the feed rod has a diameter of 90-160 mm and has a length of up to 2,5 m. Further, the typical cross sections of the feed rod may assume elliptical cross sections, which is also taken into account by the apparatus and the method.

In other words, the apparatus and the method remedy the problems that may occur due to:
 Surface morphology
 Banana-shaped, curved cylindrical shape
  And due to the cross section of the feed rod deviating from the circular shape and towards the elliptical shapes.

Figure 3:
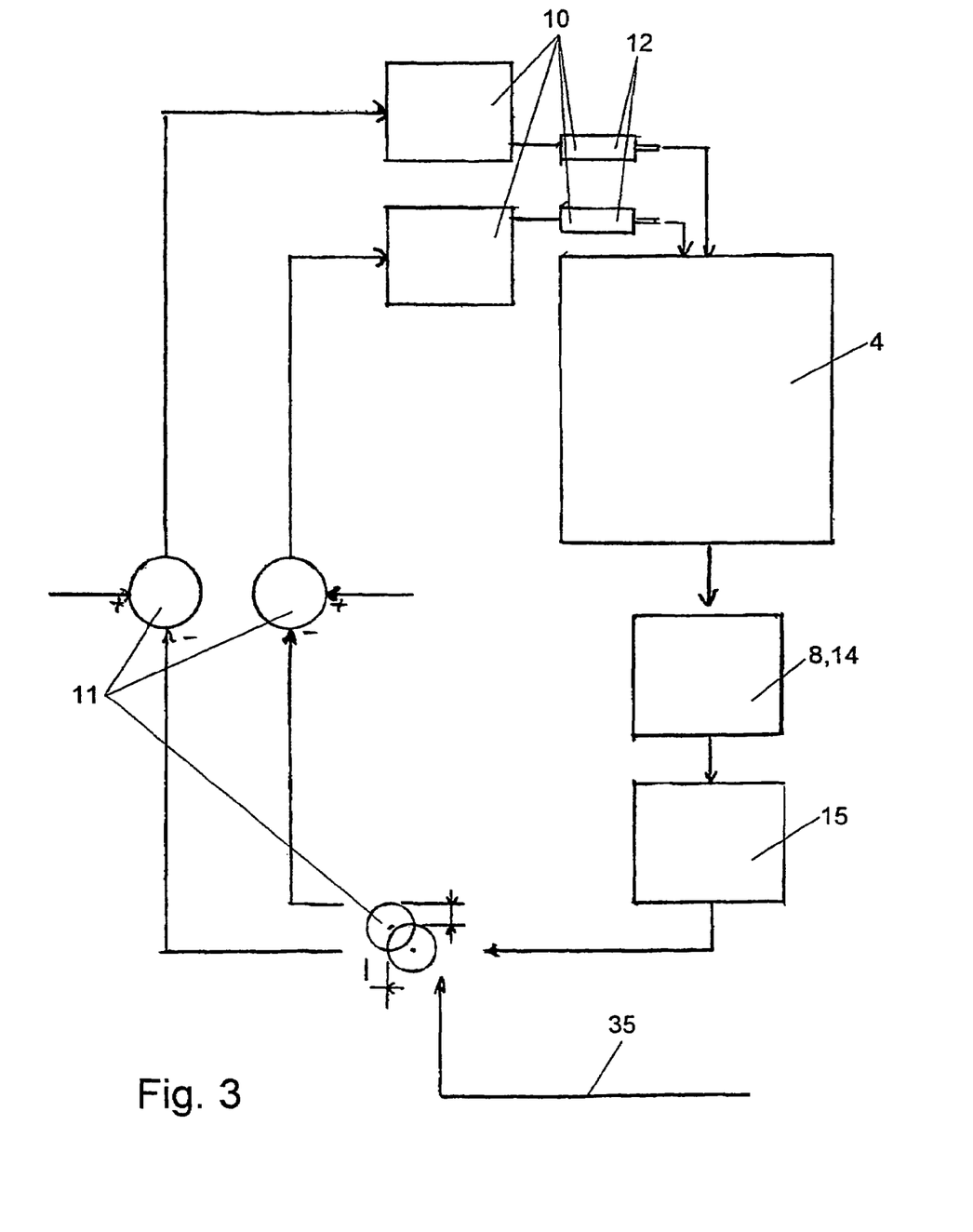
FIG. 3 shows a closed loop system for correction of the X movement of the feed rod.

Thus, FIG. 3 shows a principle for the closed-loop system that is responsible for the regulation of the process and comprises various apparatus parts. The Fz process as such takes place in the closed chamber 4. A surveillance system 8 in the form of a camera system 14 or the like performs a real time depiction of the process through the process window. These pictures are transmitted to a registration system 15 in the form of a computer unit that records and calculates the position of the feed rod relative to the annular energy supply and converts it to data that are relayed to the regulation system 11; a calculation being performed in the regulation system 11 of the adjustment to be performed by the feed rod relative to the annularly energy supply, since the distance measured between the not-melted surface and the induction coil all the way around its entire circumference has to assume the same value relative to the induction coil 13 in order to ensure uniform melt off.

Thus, the regulation system incorporates the ideal values that apply to the feed rod location in the X-Y directions, which is compared to the actual figures relayed by the computer unit as being the ones that count. Furthermore, input 35 are generated about the angle positioning of the upper shaft 18" by the actuator. On the basis of this, output are transmitted to the third moving means 10 in the form of actuator drives that relay signals to the actuators 12 about an adjustment of the X and Y directions, respectively, of the feed rod, such that it is caused to be positioned correctly and evenly in relation to the induction coil.

Figure 4:
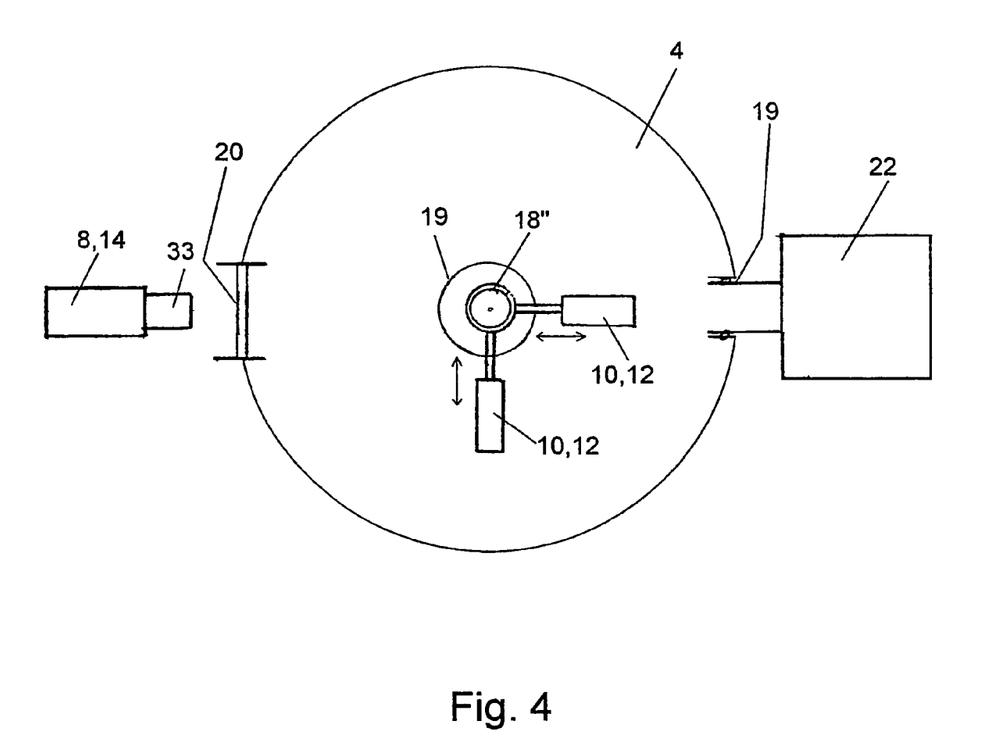
FIG. 4 is a top view of the floating zone process chamber with X-Y shaft actuators.

FIG. 4 is a top view of the floating zone process chamber comprising the upper shaft 18" and the two actuators in the form of the location of the third moving means on the shaft, such that they are able to perform the translatory movement in the X and Y directions, respectively by which an oscillating movement is performed. Likewise the top view shows the location of the monitoring system in the form of a camera 14, whose lens 33 has access through a process window 20 to the critical floating zone area.

Furthermore, opposite this, an energy supply 22 is shown for supply to the induction coil.

Figure 5:
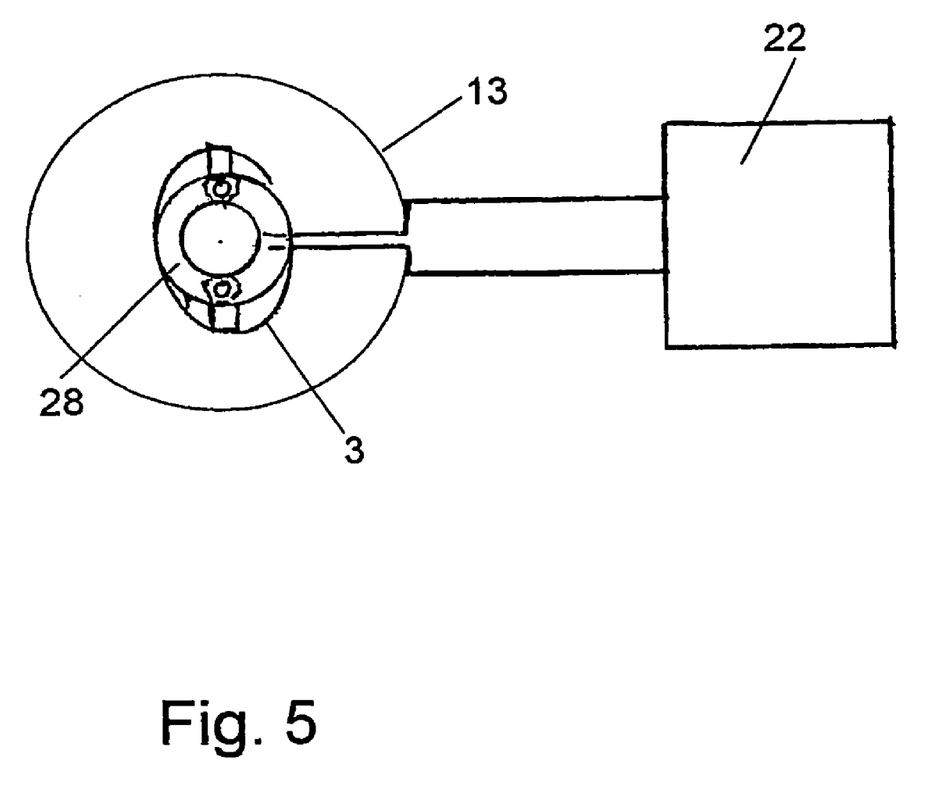
FIG. 5 is a top view of the induction coil, upper shaft and non-cylindrical/ elliptical poly silicon rod.

FIG. 5 shows the support between the upper shaft 18" and the feed rod 3 as such and shows the carrier base plate 28 as being circular and wherein an elliptical shape of the feed rod 3 is clearly distinguishable. The induction coil 13 is arranged around the feed rod as such and to the extent possible with uniform distance thereto.

Figure 6:
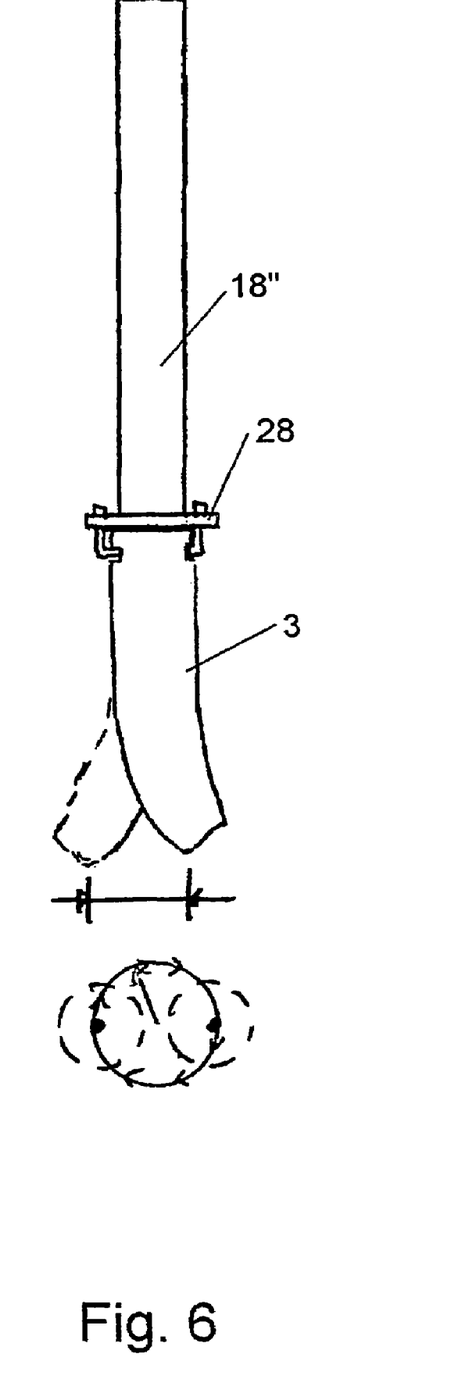
FIG. 6 shows how the silicon rod creates rotational error during the FZ process.

FIG. 6 shows a typical example of a curved feed rod 3 and wherein the erroneous rotations that will occur in case of such curved shape are outlined. Via the carrier base plate 28 the feed rod 3 is fastened to the upper shaft 18".

As mentioned above it might be necessary in those cases where the feed rod 3 has a dimpled surface to provide the induction coil with a heat reflector 17. In those cases where the surface rod is smooth, the induction coil in itself is sufficient.

Figure 7:
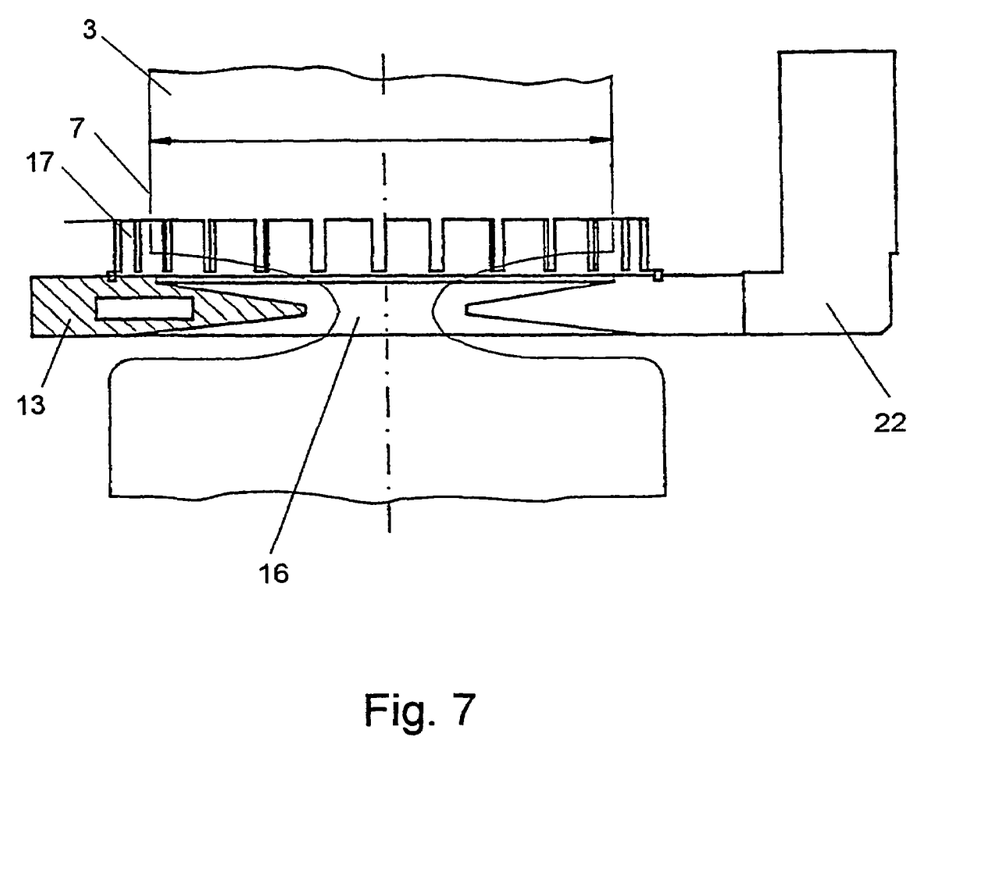
FIG. 7 shows the area where the melting off of the feed rod occurs by means of an induction coil and also the location of the heat reflector relative thereto.

As mentioned, FIG. 7 shows the cases where the induction coil 13 is equipped with a heat reflector 17. The heat reflector 17 is circular in shape and concentrically journalled about the feed rod 3. The feed rod has, at its bottom, a not-melted surface 9, and it is the distance between this not-melted surface 9 and the inner surface of the heat reflector 17 that is recorded by the camera and gives rise to changes in the X-Y system, such that the distance there is all the way around, between the not-melted surface 9 and the inner surface of the heat reflector 17 at a given time, will assume the same value.

Hereby a molten zone 16 is also accomplished that is concentrically journalled about the feed rod 3 as well as the centre axis of the single crystal 2, and therefor a uniform construction of the single crystal 2 is hence obtained.

It is noted that the feed rod material is a semi conducting material comprising an element or a mixture of elements selected from the group of elements consisting of single elements of group IV, pair of elements chosen from group IV elements, pair of elements chosen from group III and group V elements, pair of elements chosen from group 11 and group VI elements, and pair of elements chosen from group IV and group VI elements of the Periodic Table of Elements.

More specifically, in a preferred embodiment, the semi conducting material is selected from the group consisting of Si, Ge, C and SiC, or a combination thereof.

In a most preferred embodiment, the feed rod material essentially comprises silicon.

The term "essentially comprises" is intended to mean that besides the major component, the feed rod material may comprise other components e.g. impurities or additives such as dopants providing other desired properties.

The invention being thus described, it will be apparent that the same may be varied in many ways. Such variations are not to be regarded as a departure from the spirit and scope of the invention, and all such modifications as would be recognized by one skilled in the art are intended to be included within the scope of the following claims.

The invention claimed is:

1. A method of manufacturing a single crystal rod from a poly crystal feed rod, comprising:
 providing a melting zone at an end of the rod using an annular energy supply arranged around the feed rod to provide single crystals in an area below the melting zone;
 providing for movement of the feed rod in an axial direction and also providing a rotating relative movement between a surface of the feed rod and said energy supply;
 monitoring and recording a distance between an annular inwardly radially facing reference face and a surface of the feed rod; and
 regulating said distance such that, at a given point in time, the distance is the same throughout the entire circumference of the rod as measured between the feed rod surface and the reference face.

2. The method according to claim 1, further including using an induction coil to provide the melting zone.

3. The method according to claim 2, further comprising providing the reference face by using a heat reflector associated with the induction coil or the induction coil itself, said reference face being congruent with the induction coil.

4. The method according to claim 1, wherein the single crystal rod grows from the melting zone by a basic method that includes a floating zone method.

5. The method according to claim 1, further comprising using feed rods that are essentially silicon.

6. The method according to claim 1, wherein said step of recording includes taking pictures of the melting zone using a camera to monitor said distance.

7. A method of using an apparatus for manufacturing a single crystal rod from a poly crystal feed rod, the apparatus including a closed chamber at which the feed rod is located, an annular energy supply in the chamber and arranged around the feed rod for melting off one end of the rod in a melting zone to provide single crystals, actuating components for effecting axial movement of the feed rod and a rotating relative movement between the feed rod and the annular energy supply, a monitoring system for recording a distance between a surface of the feed rod and an annular, radially inwardly facing reference face associated with the annular energy supply, and an actuator for regulating said distance, the method including the steps of:
   activating said actuating components to move the feed rod in an axial direction and to also provide a rotating relative movement between a surface of the feed rod and said energy supply;
   monitoring and recording a distance between an annular inwardly radially facing reference face and a surface of the feed rod using said monitoring system; and
   regulating said distance using said actuator such that, at a given point in time, the distance is the same throughout the entire circumference of the rod as measured between the feed rod surface and the reference face.

8. An apparatus for manufacturing a single crystal rod from a poly crystal feed rod, said apparatus comprising:
   a closed chamber at which the feed rod is located, said chamber including an annular energy supply arranged around the feed rod for melting off one end of the rod in a melting zone to provide single crystals;
   components for effecting axial movement of the feed rod and a rotating relative movement between the feed rod and the annular energy supply;
   a monitoring system for recording a distance between a surface of the feed rod and an annular, radially inwardly facing reference face associated with the annular energy supply; and
   an actuator for regulating said distance.

9. The apparatus according to claim 8, further comprising a regulating system that controls and regulates the actuator as a function of the distances recorded by the monitoring system.

10. The apparatus according to claim 9, wherein the regulating system includes a microprocessor for calculating the regulation of the feed rod relative to ideal values for the location of the rod.

11. The apparatus according to claim 8, wherein the actuator provides movement in a translatory direction.

12. The apparatus according to claim 8, wherein the actuator provides movement of the feed rod in the X and Y directions, said directions being perpendicular to each other.

13. The apparatus according to claim 8, wherein said components for effecting axial and rotating relative movement include first and second actuators.

14. The apparatus according to claim 8, wherein the annular energy supply includes an induction coil.

15. The apparatus according to claim 8, wherein the apparatus further includes a movement device for axial displacement of a crystal rod.

16. The apparatus according to claim 8, wherein the monitoring system includes at least one camera located outside the chamber and configured to take pictures of the melting zone.

* * * * *